(12) United States Patent
Bergstedt et al.

(10) Patent No.: US 7,102,480 B2
(45) Date of Patent: Sep. 5, 2006

(54) PRINTED CIRCUIT BOARD INTEGRATED SWITCH

(75) Inventors: Leif Bergstedt, Sjomarken (SE); Kent Falk, Molnlycke (SE); Per Ligander, Goteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 184 days.

(21) Appl. No.: 10/475,137

(22) PCT Filed: Apr. 17, 2001

(86) PCT No.: PCT/SE01/00841

§ 371 (c)(1),
(2), (4) Date: Jan. 6, 2004

(87) PCT Pub. No.: WO02/083549

PCT Pub. Date: Oct. 24, 2002

(65) Prior Publication Data

US 2004/0112732 A1 Jun. 17, 2004

(51) Int. Cl.
H01F 27/28 (2006.01)
(52) U.S. Cl. ............. 336/232; 336/200; 336/223
(58) Field of Classification Search .......... 335/76, 335/628; 200/181, 511; 337/365; 333/24 C; 336/200, 223, 232
See application file for complete search history.

(56) References Cited

U.S. PATENT DOCUMENTS

| 5,475,318 | A | | 12/1995 | Marcus et al. |
| 5,475,353 | A | * | 12/1995 | Roshen et al. ............ 335/78 |
| 5,959,338 | A | | 9/1999 | Youngner et al. |
| 6,046,659 | A | | 4/2000 | Loo et al. |
| 6,057,520 | A | | 5/2000 | Goodwin-Johansson |
| 6,100,477 | A | | 8/2000 | Randall et al. |
| 6,124,650 | A | | 9/2000 | Bishop et al. |
| 6,239,685 | B1 | * | 5/2001 | Albrecht et al. ........... 337/365 |
| 6,320,145 | B1 | * | 11/2001 | Tai et al. ............... 200/181 |
| 6,927,644 | B1 | * | 8/2005 | Toncich ............. 333/24 C |

FOREIGN PATENT DOCUMENTS

| WO | 99/36948 | | 7/1999 |
| WO | 99/50863 | A2 | 10/1999 |

* cited by examiner

Primary Examiner—Elvin Enad
Assistant Examiner—Joselito Baisa
(74) Attorney, Agent, or Firm—Nixon & Vanderhye P.C.

(57) ABSTRACT

A printed circuit board includes a first layer on which a first stationary contact terminal is formed and one or more second layers spaced apart from the first layer by at least one intermediate layer. A portion of the one or more second layers extends into a recess formed by a discontinuity of the intermediate layers. The portion is flexible and has a second terminal which can be brought into contact with the first stationary terminal.

13 Claims, 4 Drawing Sheets

PRINTED CIRCUIT BOARD INTEGRATED SWITCH

This application is the US national phase of international application PCT/SE01/00841, filed 17 Apr. 2001, which designated the US.

FIELD OF THE INVENTION

The present invention relates generally to a switch and more particularly to a high frequency, medium to high power, switch.

BACKGROUND OF THE INVENTION

Within the field of telecom apparatuses, such as base stations for mobile telephony and terminals for mobile datacom equipment there is a need for switches and relays that provide high isolation typically exceeding 80 dB.

Micro mechanical switches (MEMS) constitute a promising technology for providing miniaturised switches on for instance Silicon substrates. This technology, however, still leaves something to be desired concerning the required high isolation. The following documents are examples of MEMS.

Prior art document U.S. Pat. No. 6,057,520 discloses an electrostatic operated device comprising a substrate, an insulating layer, and a substrate electrode for providing repulsive forces and an insulating layer. A movable electrode is of flexible material is deposited on the planar surface such that a distal portion can curl away from the planar surface. Two composite layers with different thermal coefficients of expansion will also curl the electrode.

U.S. Pat. No. 6,124,650 shows a MEMS magnetic actuation device comprising a latchable cantilever on which a soft latchable magnetic member is placed and a plane coil for moving the cantilever. Both the cantilever and the coil are mounted on a thin field substrate. This document moreover mentions that thermal; magnetic and electrostatic MEMS relays are known in the art.

U.S. Pat. No. 5,475,318 shows a micro-cantilever with an integrated heating element comprising fist and second layers, such as silicon dioxide and aluminium, of different coefficients of thermal expansion. The micro-cantilever has a tip, which is brought into contact with a material for measuring friction during atomic force microscopy.

U.S. Pat. No. 6,100,477 shows a MEMS electrostatic RF switch having a membrane, which is attached, by respective flexure structures, in two opposite ends to a substrate.

U.S. Pat. No. 5,959,338 discloses an electrostatic relay mounted on a silicon wafer. The relay comprises an upper poly-silicon diaphragm, a central electrode and a lower poly-silicon diaphragm. A conductive depression in the wafer and a conductive portion of the lower diagram will make contact due to electrostatic forces.

WO9936948 discloses a micro-mechanical device manufactured on a silicon substrate. On the silicon substrate, silicon dioxide layers are formed for etching material and releasing meander shaped cantilever beams. A top metal layer is sputtered on the silicon dioxide layer. The top metal layer extends to vertical sections on the cantilever beams.

SUMMARY OF THE INVENTION

The invention seeks to provide a switch offering high isolation and good power and high frequency handling, which can be manufactured with standard production tools.

This object has been accomplished by the subject matter defined by claim 1.

It is another object to provide a switch integrated in a printed circuit board.

This object has been accomplished according to claim 2.

It is another object to provide a switch that is activated by force impact.

This object has been accomplished by claim 3.

It is another object to provide an electrically activated switch.

This object has been achieved by claims 5 and 6.

It is another object to achieve an even more compact switch.

This object has been achieved by claims 8 and 9.

Further advantages will appear from the following detailed description of the preferred embodiments of the invention.

DETAILED DESCRIPTION OF PREFERRED EMBODIMENTS OF THE INVENTION

Figure 1:
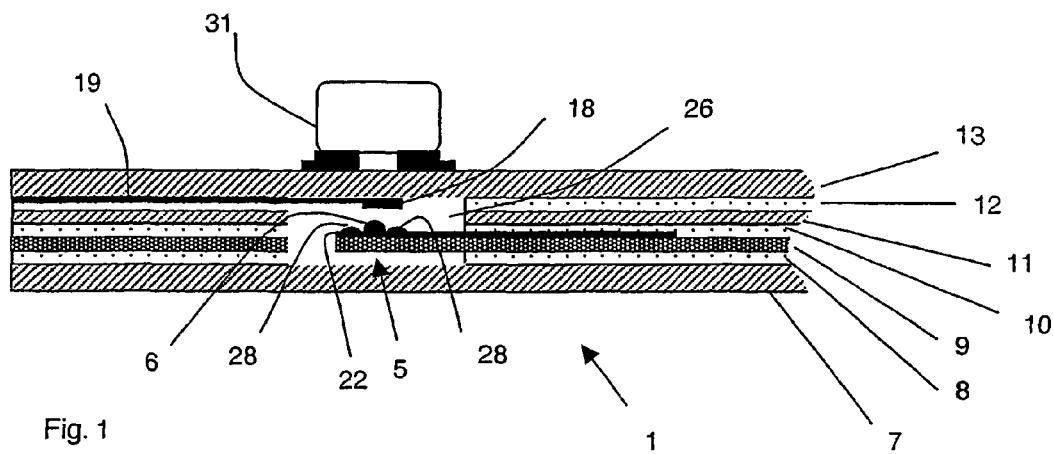
FIG. 1 shows a first embodiment of the invention.

In FIG. 1, a switch being integrated in a printed circuit board 1 has been shown.

The printed circuit board 1 has a first layer 13 on which a first stationary contact terminal 18 is formed. The first terminal is connected to a first conductive strip layer 19 on the first layer 13.

One or more second layers 9, 22 are provided comprising for instance a carrier laminate 9 of polyimide and a second conductive strip layer 22. The latter second layers are spaced apart from the first layer 13 by at least one intermediate layer—preferably comprising a prepreg layer 10, a laminate layer 11, and a prepreg layer 12.

It should be understood that the conductive strip layers 19 and 22 advantageously form part of conventional circuit board connections (not shown) to other optional components (not shown) on the printed circuit board by appropriate patterns and via holes. For this purpose, additional conductive layers may be formed on for instance the laminate 11.

Figure 3:
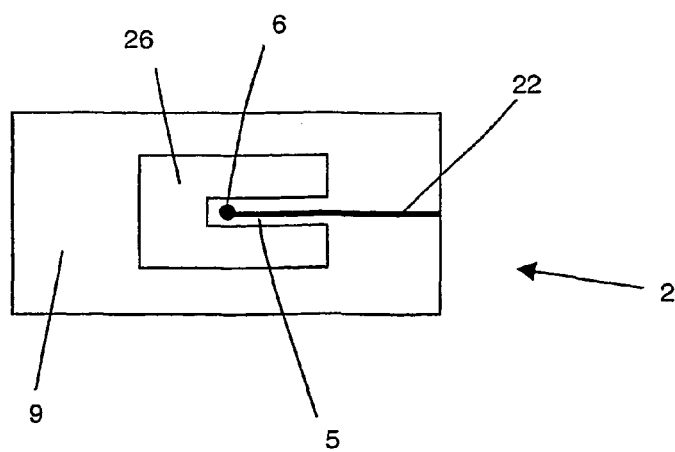
FIG. 3 shows a first embodiment of a flexible portion shown in FIGS. 1 and 2.

A portion 5 of said one or more second layers 9, 22 extend into a recess 26 formed by a discontinuity of the intermediate layers 10, 11, 12. The portion 5 in the printed circuit board is flexible and has a second terminal 6, which can be brought into contact with the first stationary terminal 18. In FIG. 3, a cross section of the carrier laminate 9 with the flexible portion 5 being outlined as tongue has been shown.

Moreover, the printed circuit board has a bottom layer of laminate 7 whereon a layer of prepreg 8 having a corresponding recess 26 to the recess mentioned above. Hence, the flexible portion 5 is forming a tongue on a carrier substrate 9 that extend into the recess 26.

Preferably, the second terminal 6 is formed by an elevated platform for establishing a well-defined contact point. Likewise, the first terminal 18 is rendered elevated.

Alternatively, the first conductive strip layer is forming the first terminal 18 and/or the second conductive strip layer 22 is forming the second terminal 6.

Magnetic material deposits 28 are provided near and on the same side of the second terminal 6.

Opposite the first terminal 18, on the other side of the second the laminate layer 13, a solenoid 31 is mounted for attracting the magnetic material deposits 28 on the tongue 4 upon appliance of a direct current over a set of terminals (not shown) to the solenoid 31. Thereby, the flexible tongue 5 bends and the first terminal 18 and the second terminal 6 connect.

As appears from FIG. 1, the switch is completely enclosed in the printed circuit board. Advantageously, conductive layers (not shown) on the external sides of laminates 7 and 13 may be provided for providing electrical screening. Hence, a cost-effective relay, with electrical properties similar to a coax relay, has been accomplished.

As appears from the above embodiment, the recess 26 is forming a sealed enclosure. It is envisioned that the enclosure could serve to obtain a clean and particle free "contact" environment around the switch terminals ensuring obviating pollution of terminals and a corresponding long operating life. The enclosure may contain air, a gas or vacuum. Even a liquid may be used.

Since the switch function is integrated in the carrier, the switch may advantageously form part of a microwave transmission line, e.g. a strip-line circuit. In this case, the flexible portion 5 and the recess 26 are preferably dimensioned such that the characteristic impedance of the transmission line remains unchanged over the switch.

In the following, an exemplary manner of manufacturing especially the flexible portion will be described.

In FIGS. 8–16, exemplary process steps for manufacturing the central flexible portion 5, corresponding to layers 7–13, have been illustrated.

The carrier 9 may be formed of FR4—a laminate of polyimide, with copper layers 22 and 32 on both sides—although other materials may be used. The polyimide layer may have a thickness of 50 μm and the copper a thickness of 18 μm.

Initially, a photo-resist 33 is applied on the laminate 9. An opening of for instance 1 mm is formed. This has been shown in FIG. 8. The carrier is electro-plated with copper whereby a bottom layer is deposited in the opening on the copper layer 22. Subsequently, the opening is filled by chemical plating to the extent shown in FIG. 9.

Figure 10:
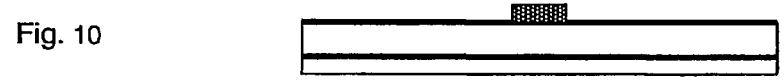

After the photo-resist is removed, FIG. 10 a surface treatment of gold and nickel depositing is applied, whereby the elevated terminal 6 is formed.

Figure 11:
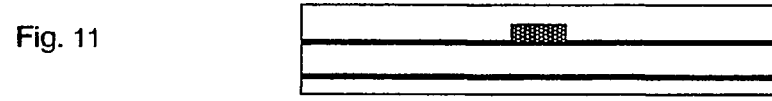
Figure 12:
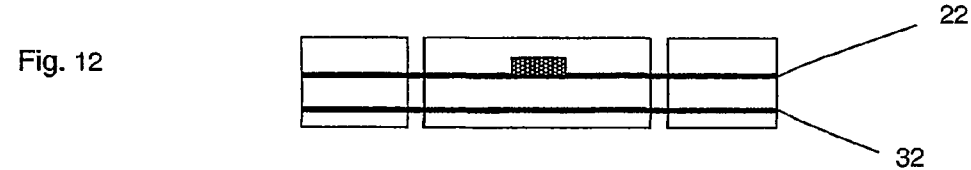
Figure 13:
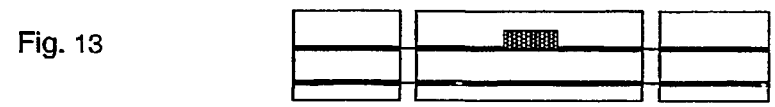
Figure 14:
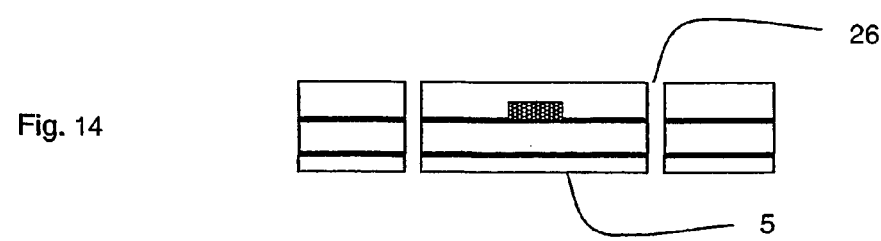

A resist layer 34 is provided over the structure, FIG. 11. Patterns in the resist layers are removed, FIG. 12, and the tongue 5 having an extension of about 2–5 mm is carved out by laser cutting or plasma etching. First, the copper layers are removed by chemical etching, FIG. 13, then the polyimide layer 9 is removed by laser cutting as indicated in FIG. 14.

Figure 15:

The etch resist 34 is removed and the structure shown in FIG. 15 appears.

Figure 16:

Finally, polymer pasta containing magnetic material is printed by a silk screen process on the tongue 5 with subsequent low temperature hardening for forming the magnetic deposits 28, confer FIG. 16. Thereby, the tongue shown in FIG. 1 is produced. The magnetic deposits may be formed as an area surrounding the terminal 6 or as dots.

The additional layers of FIG. 1, are manufactured by known steps, which involve stacking, non-flow heating of the prepreg layers 8 and 11 and pressing the structure together with laminate 7 and laminate 11. Finally, the laminate 13 is attached to prepreg 12 and the above structure by non-flow heating and pressing.

The second laminate 13, of for instance FR4 with a copper layer, is exposed to the same treatment as above whereby the strip 19 is formed having the second elevated contact platform 20.

The magnetic coil may be constituted by means of additional PCB layers, e.g. of prepreg 14 and polyamide 15, in which a central magnetic core 16 and coil windings 17 are integrated.

Figure 2:
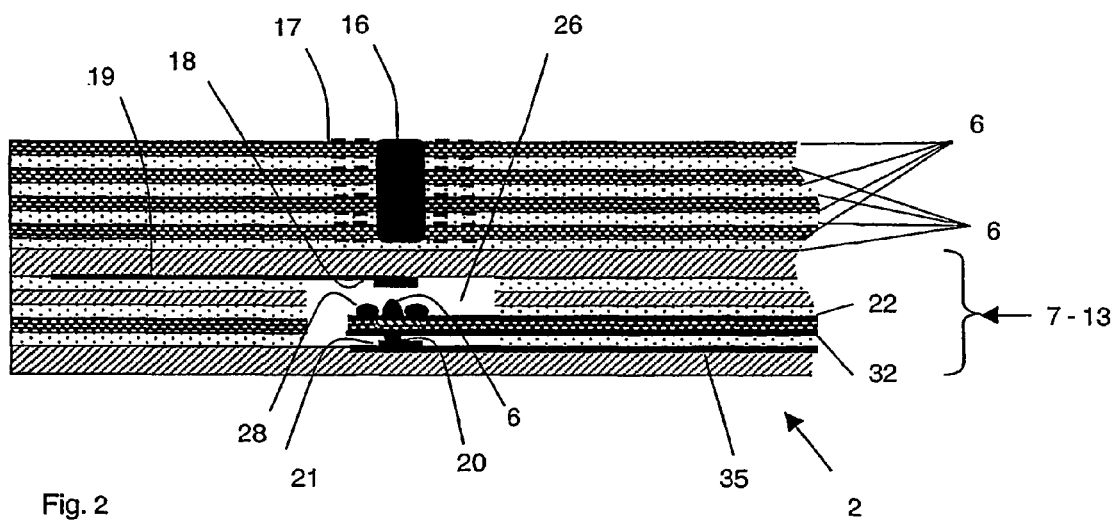
FIG. 2 shows a second embodiment of the invention.

This solution has been shown on the FIG. 2 embodiment of the switch 2, which has a basis similar to layers 7–13 of FIG. 1.

In the additional layers 14/15, which may have an extension of 4–5 mm, coil pattern layers 17 are provided by photo resist techniques and connected by copper plated via holes (not shown). In the centre of the coil pattern, a hole is drilled in the additional layers 14/15 in which magnetic polymer pasta is applied for forming a magnetic core 16 for concentrating the magnetic field.

As appears from FIG. 2, a third contact terminal 20 connecting to layer 32 is provided on the laminate 7. Moreover, a fourth terminal 21 connecting to a fourth strip layer 35 on laminate 7 is provided.

Thereby the switch may provide electrical connection in its rest position. For instance, the second terminal 6 may be connected with the third terminal 20 by a via (not shown).

Hence, a complete relay functionality has been integrated in the printed circuit board.

Like the above embodiment, the switch 2 may advantageously form part of a microwave transmission line, e.g. a strip-line. Where the flexible portion 5 is in contact with terminal 20 in its resting position, the switch is advantageously dimensioned such that it forms a continuation of the strip-line without any substantial change to the characteristic impedance. Moreover, the switch may constitute a termination, whereby the terminal 20 is connected to a resistance.

Figure 8:
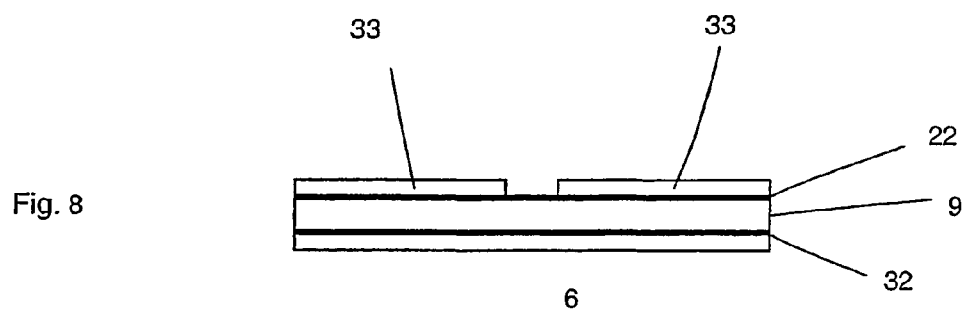
FIGS. 8–16 shows process steps for manufacturing the flexible portion.
Figure 9:

In FIG. 8, a printed circuit board having a switch is shown wherein the flexible portion is moved by force being exerted via a member 30, such as a tool or a part of another apparatus through an aperture 29 in the laminate 7.

One application for the above switch may for instance be in a circuit that is rarely activated by for instance a service technician, for test purposes, hence justifying a particular cost effective or compact realisation. However, the suitable applications are deemed virtually unlimited.

Figure 4:
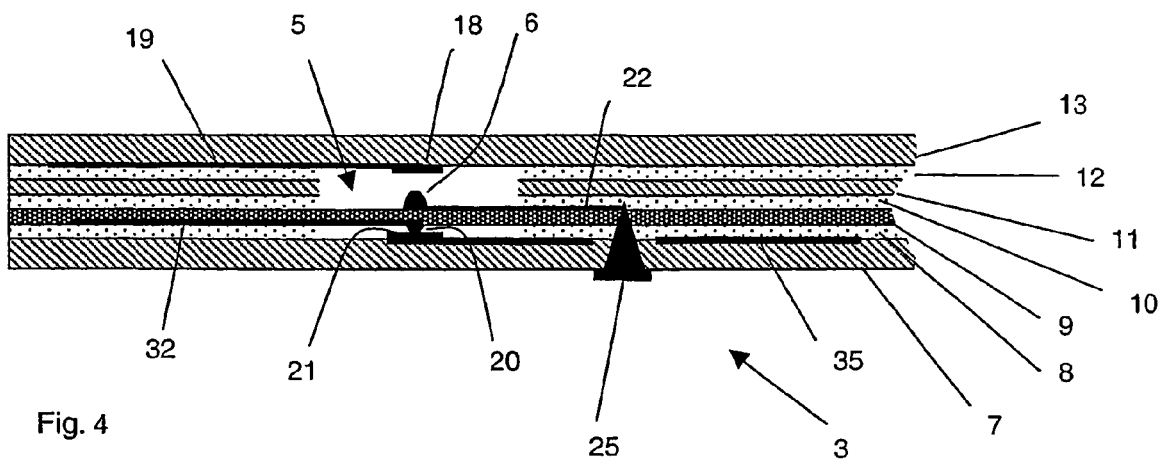
FIG. 4 shows a third embodiment of the invention.
Figure 5:
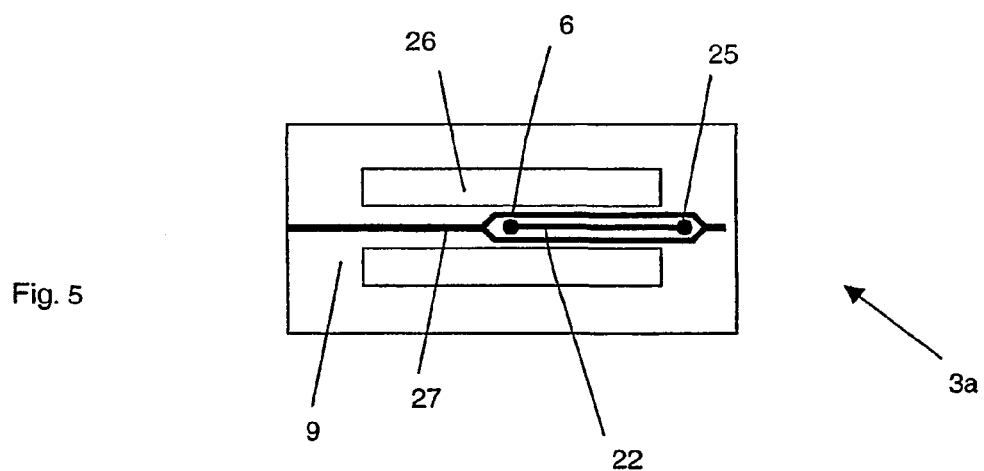
FIG. 5 shows a flexible portion of FIG. 4.
Figure 6:
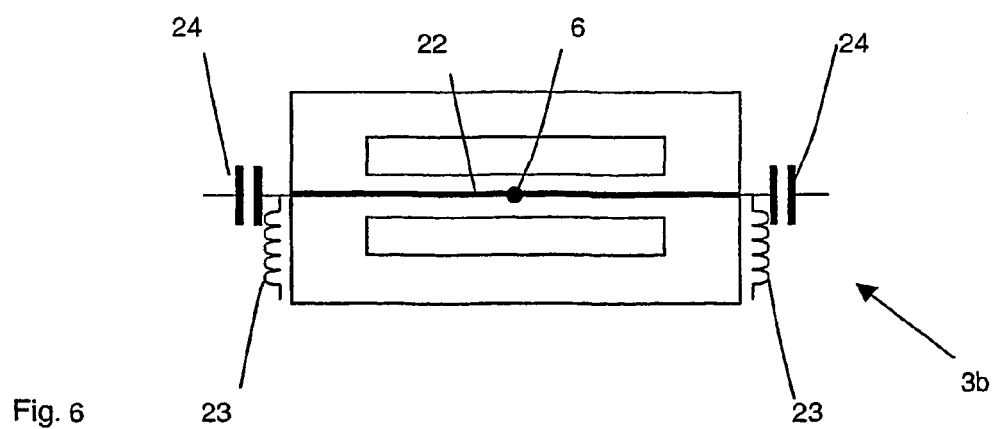
FIG. 6 shows an alternative embodiment to FIG. 5.
Figure 7:
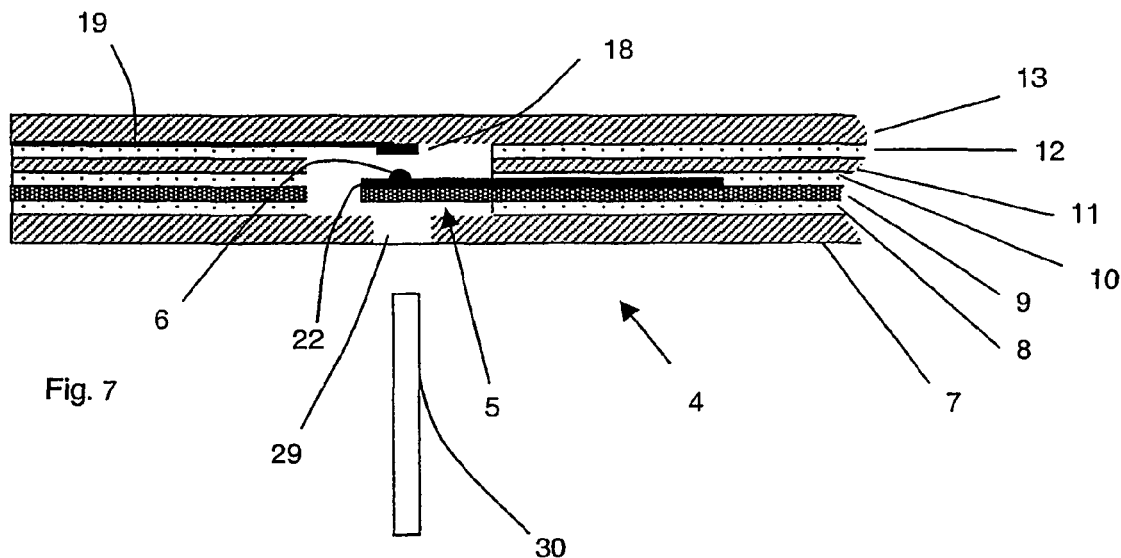
FIG. 7 shows a fourth embodiment of the invention.

In FIGS. 4–6, further embodiments of the present invention have been shown.

The flexible portion may also be moved by exposing the flexible portion to thermal expansion.

In FIGS. 4 and 5, the flexible portion 5 is outlined as a bridge portion. On the flexible portion, a heat strip 27 having a given ohmic resistivity has been provided. By applying a current through the heat strip 27, power is dissipated in the flexible portion leading to the corresponding part of the flexible portion being heated, effecting a rise of the flexible portion. After sufficient heating, the second terminal 6 is brought into contact with the first terminal 18 and the strip 19 is brought into communication with strip 22. By continued heating, the terminals remain in contact.

As appears from FIG. 5, the heat strip 27 and the strip 22 are symmetrical with regard to the flexible portion for obtaining a smooth non twisted thermal expansion. A via 25 is provided for obtaining connection to the strip 22.

An alternative to the above circuit is shown in FIG. 6, whereby the switching circuit, in the embodiment of strip 22, forms part of the heating circuit. The current used for heating the flexible portion is provided by a low or high pass filter formed by inductors 23 and capacitors 24 and separated from the signal or power being switched over first and second terminals 6 and 18.

The above embodiment is highly compact allowing a high package density.

The invention claimed is:

1. A printed circuit board comprising:
    a substrate that includes;
        a first substrate layer;
        a second substrate layer formed over the first substrate layer;
        a third substrate layer formed over the second substrate layer;
        a fourth substrate layer formed over the third substrate layer;
        a fifth substrate layer formed over the fourth substrate layer,
    wherein a flat and flexible portion of the third substrate layer extends into a recess formed by a discontinuity of the second and fourth substrate layers;
    a first conductive strip layer formed on the flat and flexible portion of the third substrate layer;
    a second conductive strip layer formed on the fifth substrate layer in the recess;
    an actuator located on or above the fifth substrate layer over the recess,
    wherein the actuator is arranged so that actuation of the actuator exerts a force on the first conductive strip layer causing the flat and flexible portion of the third substrate layer to move in the recess so that there is contact between the first conductive strip layer formed on the flat and flexible portion of the third substrate layer and the second conductive strip layer formed on the fifth substrate layer.

2. The printed circuit board according to claim 1, wherein a first conductive strip layer is connected with or is formed with a first terminal and a second conductive strip layer is connected with or is formed with a second terminal.

3. The printed circuit board according to claim 1, wherein the flat and flexible portion of the third substrate layer is a tongue.

4. The printed circuit board according to claim 3, wherein the actuator is a member, such as a tool.

5. The printed circuit board according to claim 3, wherein the actuator is a coil, and magnetic material is arranged on the flat and flexible portion of the third substrate layer.

6. The printed circuit board according to claim 5, wherein the coil is a solenoid component.

7. The printed circuit board according to claim 5, wherein the coil includes additional substrate layers in which a coil pattern is embedded, the additional layers forming part of the printed circuit board.

8. The printed circuit board according to claim 1, wherein the flat and flexible portion of the third substrate layer is a bridge.

9. The printed circuit board according to claim 8, wherein a heat circuit is provided on or in the flat and flexible portion of the third substrate layer for exposing the flat and flexible portion of the third substrate layer to thermal expansion when the heat circuit is subject to an electrical current.

10. The printed circuit board according to claim 9, wherein the heat circuit includes a separate heat strip arranged on the flat and flexible portion of the third substrate layer.

11. The primed circuit board according to claim 9, further comprising:
    a conductor for providing via a low or high pass filter to provide heat to the flat and flexible portion of the third substrate layer.

12. The printed circuit board according to claim 1, wherein the flat and flexible portion of the third substrate layer and a portion the first and second conductive strip layers are housed inside of the recess, the recess being enclosed in the printed circuit board.

13. The printed circuit board according to claim 1 wherein at least one the conductive strip layers, the flat and flexible portion of the third substrate layer, and the recess form a strip-line.

* * * * *